United States Patent
Ito

(10) Patent No.: US 7,626,148 B2
(45) Date of Patent: Dec. 1, 2009

(54) TOUCH KEY AND INDUCTION HEATING COOKING DEVICE EMPLOYING THE SAME

(75) Inventor: Shinichi Ito, Hyogo (JP)

(73) Assignee: Panasonic Corporation, Osaka (JP)

( * ) Notice: Subject to any disclaimer, the term of this patent is extended or adjusted under 35 U.S.C. 154(b) by 114 days.

(21) Appl. No.: 11/572,356

(22) PCT Filed: Oct. 6, 2005

(86) PCT No.: PCT/JP2005/018524

§ 371 (c)(1),
(2), (4) Date: Jan. 19, 2007

(87) PCT Pub. No.: WO2006/043424

PCT Pub. Date: Apr. 27, 2006

(65) Prior Publication Data

US 2007/0221664 A1    Sep. 27, 2007

(30) Foreign Application Priority Data

Oct. 19, 2004    (JP)    ............................. 2004-304094

(51) Int. Cl.
*H05B 6/10* (2006.01)
*H05B 6/00* (2006.01)
(52) U.S. Cl. ...................................... 219/620; 219/618
(58) Field of Classification Search ................ 219/620, 219/621, 622, 623, 624, 625, 626, 627, 628, 219/629, 630, 631
See application file for complete search history.

(56) References Cited

U.S. PATENT DOCUMENTS 4,352,000 A * 9/1982 Fujishima et al. ........... 219/626
4,446,350 A * 5/1984 Mizukawa et al. .......... 219/622
4,900,884 A * 2/1990 Aoki ........................... 219/601

(Continued)

FOREIGN PATENT DOCUMENTS

EP    0 668 657 A1    8/1995

(Continued)

OTHER PUBLICATIONS

International Search Report for corresponding PCT International Application No. PCT/JP2005/018524 dated Nov. 29, 2005.

(Continued)

*Primary Examiner*—Daniel L Robinson
(74) *Attorney, Agent, or Firm*—RatnerPrestia

(57) ABSTRACT

A touch key detects that an object touches the touch key. The touch key includes an electrode arranged to be touched with the object, an oscillator for outputting a high-frequency voltage and applies the high-frequency voltage to the electrode, a rectifier for rectifying and smoothing the high-frequency voltage output from the oscillator as to output a direct-current (DC) voltage, a reference voltage generator for generating a reference voltage, a subtracter for subtracting the reference voltage from the DC voltage output from the rectifier, a judging unit for detecting a voltage difference between the voltage output from the subtracter before and after changing and for determining that the object touches the electrode when the voltage difference exceeds a predetermined value. This touch key detects that an object touches the electrode with high sensitivity, and enhances the reliability of the judging unit.

4 Claims, 6 Drawing Sheets

U.S. PATENT DOCUMENTS 5,446,268 A * 8/1995 Chen .................... 219/623

FOREIGN PATENT DOCUMENTS

| JP | 03-145329 | 6/1991 |
| JP | 04-97614 A | 3/1992 |
| JP | 06-140902 A | 5/1994 |
| JP | 2002-039708 | 2/2002 |
| JP | 2002-39708 A | 2/2002 |
| JP | 2003-029899 | 1/2003 |
| JP | 2003-224459 | 8/2003 |

OTHER PUBLICATIONS

Supplementary European Search Report dated Feb. 5, 2009 for EP 05 79 0589.

* cited by examiner

TOUCH KEY AND INDUCTION HEATING COOKING DEVICE EMPLOYING THE SAME

THIS APPLICATION IS A U.S. NATIONAL PHASE APPLICATION OF PCT INTERNATIONAL APPLICATION NO. PCT/JP2005/018524 filed OCT. 6, 2005.

TECHNICAL FIELD

The present invention relates to a touch key and to an induction heating cooker using the touch key.

BACKGROUND OF THE INVENTION

FIG. 9 is a block diagram of conventional touch key 1001 disclosed in Japanese Patent Laid-Open Publication No. 2003-224459. Electrode 2 is provided on a surface of panel 1 made of an electrical insulator, such as glass, having a flat surface. Electrode 3 facing electrode 2 is provided on the other surface of panel 1. Electrode 2 and 3 and panel 1 provides a capacitor. Oscillator 4 outputs a high-frequency voltage, and outputs the voltage to electrode 3. Oscillator 4 has high output impedance. When finger 9, a conductive object, touches electrode 2, electrode 3 is bypassed through panel 1, electrode 2, and finger 9 to be grounded, thereby reducing the high-frequency voltage at electrode 3 to a voltage lower than that before finger 9 touches electrode 2. Rectifier 5 rectifies and smoothes the high-frequency voltage output from oscillator 4, the high-frequency voltage applied to electrode 3, so as to convert the high-frequency voltage to a direct-current (DC) voltage, and outputs the DC voltage to voltage divider 12. The DC voltage appearing when electrode 2 is not touched is higher than the voltage appearing when electrode 2 is touched. Voltage divider 12 divides the DC voltage output from rectifier 5 and outputs a low DC voltage having an absolute value lower than that of the DC voltage output from rectifier 5 to judging unit 13. When the direct-current voltage input to judging unit 13 changes, judging unit 13 calculates a voltage difference between voltages before and after the change, and determines that finger 9 touches electrode 2 if the voltage difference exceeds a predetermined value. The DC voltage output from rectifier 5 has a high absolute value, and may accordingly break judging unit 13 or causes judging unit 13 to malfunction. In order to prevent this problem, the DC voltage output from rectifier 5 is divided by voltage divider 13 to be lowered to a predetermined level.

FIG. 10 illustrates the high-frequency voltage output from oscillator 4. Finger 9 does not touch electrode 2 before time T0, and continues touching electrode 2 after time T0. Before time T0, finger 9 does not touch electrode 2, hence causing oscillator 4 to output voltage Vosc101. After time T0, finger 9 touches electrode 2, hence causing oscillator 4 to output voltage Vosc102 having an amplitude smaller than that of Vosc101. FIG. 11 illustrates the DC voltage output from rectifier 5. Voltage V10 output when finger 9 does not touch electrode 2 is a DC voltage into which voltage Vosc101 before time T0 shown in FIG. 10 is converted. Voltage V11 output after time T0 when finger 9 touches electrode 2 is a DC voltage into which voltage Vosc102 shown in FIG. 10 is converted. Thus, finger 9 touches electrode 2, thereby producing voltage difference $\Delta V6$ between voltages V10 and V11.

Judging unit 13 generally includes a semiconductor, such as a microprocessor, which is weak to an excessive input, and accordingly, it is important that a voltage input thereto is limited. FIG. 11 shows voltage Vk, an upper limit of the voltage input to judging unit 13. The voltage output from rectifier 5 is higher than upper limit voltage Vk, and hence cannot be input to judging unit 13.

FIG. 12 illustrates the voltage output from voltage divider 12. Voltage divider 12 divides voltages V10 and V11 output from rectifier 5 to output voltages V12 and V13, respectively. Judging unit 13 detects voltage difference $\Delta V7$ between voltages V12 and V13 as to determine that finger 9 touches electrode 2 when voltage difference $\Delta V7$ exceeds a predetermined value.

A cooker including touch key 1001 is operated while a cooked object is being looked at, hence being used easily.

In touch key 1001, voltage difference $\Delta V7$ between voltages V12 and V13 is divided as well as voltages V10 and V11, and thus being smaller than voltage difference $\Delta V6$. Voltage difference $\Delta V6$ is thus small, and accordingly reduces the sensitivity of the judging of judging unit 13 to determine whether finger 9 touches electrode 3 or not.

SUMMARY OF THE INVENTION

A touch key detects that an object touches the touch key. The touch key includes an electrode arranged to be touched with the object, an oscillator for outputting a high-frequency voltage and applies the high-frequency voltage to the electrode, a rectifier for rectifing and smoothing the high-frequency voltage output from the oscillator as to output a direct-current (DC) voltage, a reference voltage generator for generating a reference voltage, a subtracter for subtracting the reference voltage from the DC voltage output from the rectifier, a judging unit for detecting a voltage difference between the voltage output from the subtracter before and after changing and for determining that the object touches the electrode when the voltage difference exceeds a predetermined value.

This touch key detects that an object touches the electrode with high sensitivity, and enhances the reliability of the judging unit.

REFERENCE NUMERALS

1 Panel
2 Electrode

3 Electrode
4 Oscillator
5 Rectifier
6 Subtracter
7 Reference Voltage Generator
8 Judging Unit
9 Finger (Object)
10 Differentiator
11 Judging Unit

DETAILED DESCRIPTION OF PREFERRED EMBODIMENTS

Exemplary Embodiment 1

Figure 1:
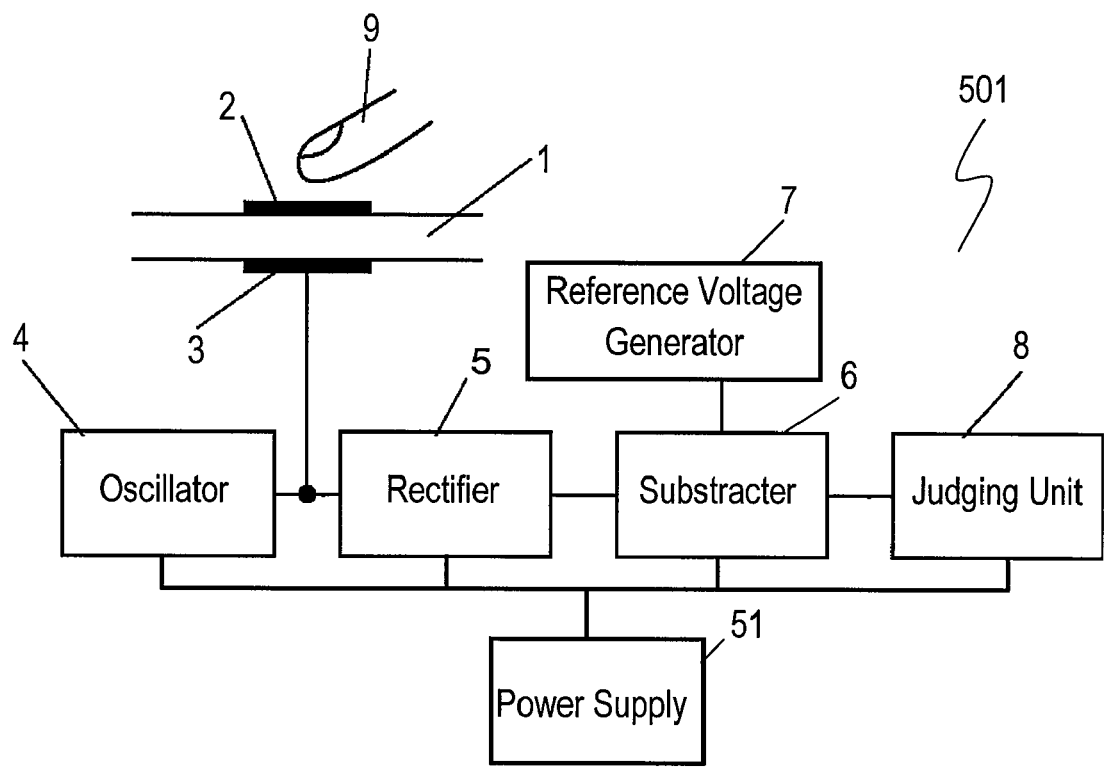
FIG. 1 is a block diagram of a touch key according to Exemplary Embodiments 1 to 3 of the present invention.

FIG. 1 is a block diagram of touch key 501 according to Exemplary Embodiment 1 of the present invention. Electrode 2 is provided on a surface of panel 1 made of an electrical insulator, such as glass or ceramics, having a flat surface. Electrode 3 facing electrode 2 is provided on the other surface of panel 1. Electrodes 2 and 3 and panel 1 provides a capacitor. Oscillator 4 outputs a high-frequency voltage, and supplies the voltage to electrode 3. Oscillator 4 has high output impedance. When finger 9, a conductive object, touches electrode 2, electrode 3 is bypassed through panel 1, electrode 2, and finger 9 to be grounded, thereby reducing the high-frequency voltage at electrode 3 to a voltage lower than that before finger 9 touches electrode 2. Rectifier 5 rectifies and smoothes the high-frequency voltage output from oscillator 4, the high-frequency voltage supplied to electrode 3, as to convert the voltage to a direct-current (DC) voltage, and outputs the DC voltage to subtracter 6. The DC voltage output from rectifier 5 when electrode 2 is not touched is higher than the DC voltage output when electrode 2 is touched. Reference voltage generator 7 generates a reference voltage, a predetermined DC voltage. Subtracter 6 subtracts the reference voltage from the DC voltage output from rectifier 5, and outputs a DC voltage having an absolute value lower than that of the DC voltage output from rectifier 5 to judging unit 8. When the DC voltage input to judging unit 8 changes, judging unit 8 calculates a voltage difference between voltages before and after the change, and determines that finger 9 touches electrode 2 if the voltage difference exceeds a predetermined value. Power supply 51 supplies power to oscillator 4, rectifier 5, subtracter 6, judging unit 8, and reference voltage generator 7.

Figure 2:
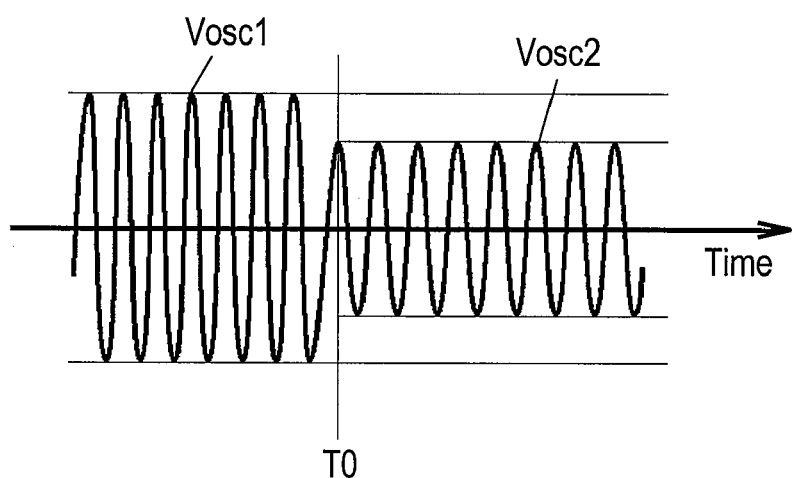
FIG. 2 illustrates a voltage output from an oscillator of the touch key according to Embodiments 1 to 3.

FIG. 2 illustrates the high-frequency voltage output from oscillator 4. Finger 9 does not touch electrode 2 before time T0 and continues touching electrode 2 after time T0. Before time T0, finger 9 does not touch electrode 2, hence causing oscillator 4 to output voltage Vosc1. After time T0, finger 9 touches electrode 2, hence causing oscillator 4 to output voltage Vosc2 having an amplitude smaller than that of voltage Vosc1.

Figure 3:
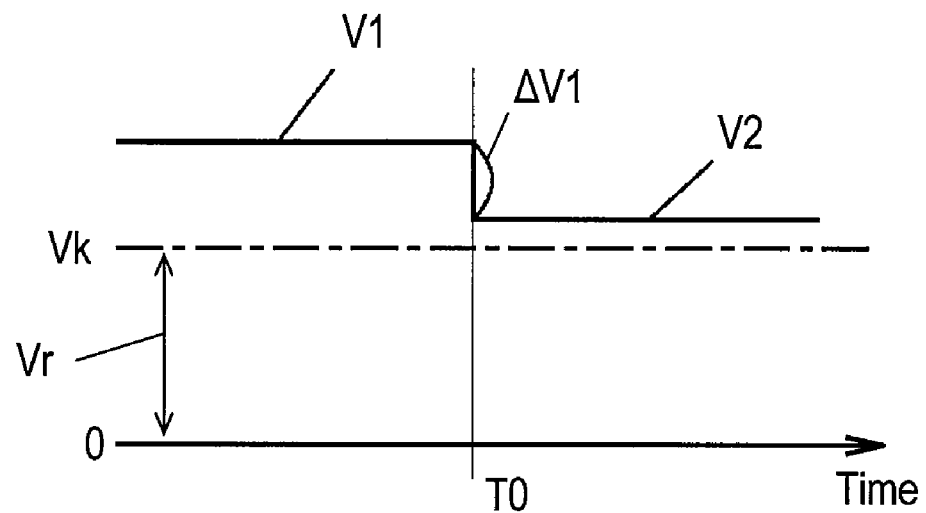
FIG. 3 illustrates a voltage output from a rectifier of the touch key according to Embodiments 1 to 3.

FIG. 3 illustrates the DC voltage output from rectifier 5. Voltage V1 output when finger does not touch electrode 2 is a DC voltage into which voltage Vosc1 is converted before time T0 shown in FIG. 2. Voltage V2 output while finger 9 continues touching electrode 2 after time T0 is a DC voltage into which voltage Vosc2 shown in FIG. 2 is converted. Finger 9 touches electrode 9, thus producing voltage difference ΔV1 between voltages V1 and V2.

Figure 4:
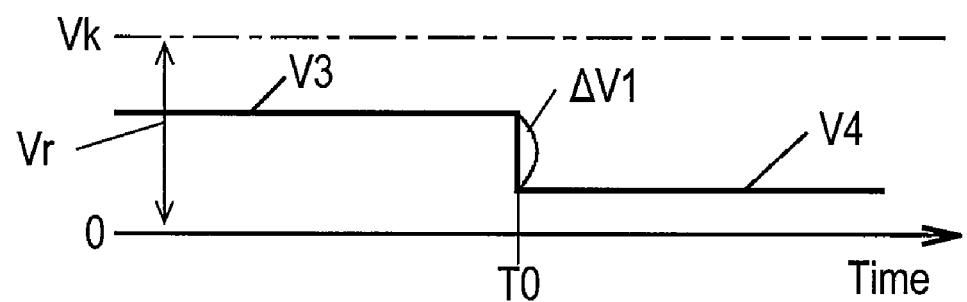
FIG. 4 illustrates a waveform of a voltage output from a subtracter according to Embodiments 1 to 3.

FIG. 4 illustrates the DC voltage output from subtracter 6. Subtracter 6 subtracts the predetermined reference voltage output from reference voltage generator 7, from voltages V1 and V2 output from rectifier 5 as to voltages V3 and V4, respectively. The voltage difference between voltages V3 and V4 is identical to voltage difference ΔV1 between voltages V1 and V2. Judging unit 8 detects voltage difference ΔV1 between voltages V3 and V4, and determines that finger 9 touches electrode 2 when voltage difference ΔV1 exceeds a predetermined value.

When the voltage output from rectifier 5 exceeds voltage V2, judging unit 8 detects the voltage difference between voltage V4 and a voltage exceeding voltage V4, and judges that finger 9 moves apart from electrode 2 when the voltage difference exceeds a predetermined value.

Figure 12:
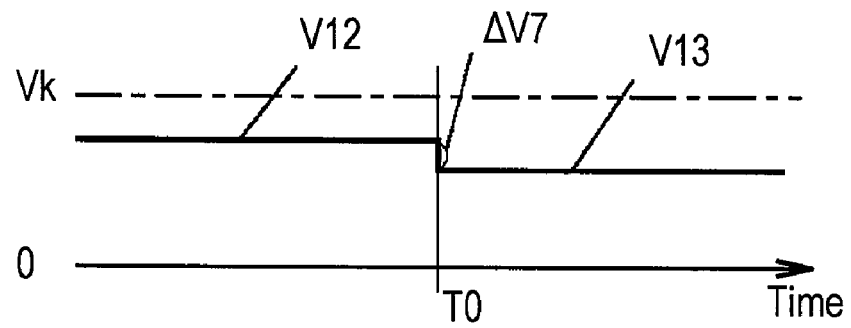
FIG. 12 illustrates a voltage output from a voltage divider of the conventional touch key.

Judging unit 8 is generally includes a semiconductor, such as a microprocessor, which is weak to an excessive input, and accordingly, it is important that a voltage input to judging unit 8 is limited. FIGS. 3 and 4 illustrate maximum tolerable input voltage Vk which is an upper limit of a voltage input to judging unit 8. Voltages V1 and V2 higher than voltage Vk, upon being input to judging unit 8, may break judging unit 8 or cause judging unit 8 to malfunction. In this case, judging unit 8 has tolerable range Vr of the input voltage between 0V and maximum tolerable input voltage Vk. In touch key 501 according to Embodiment 1, subtracter 6 has voltage difference ΔV1 unchanged, lowers the absolute voltage level of voltage difference ΔV1, and suppresses voltages V3 and V4 below tolerable input voltage Vk, thus limiting the absolute levels of voltages V3 and V4 within tolerable range Vr of the voltage input to judging unit 8. Voltage difference ΔV1 larger than voltage difference ΔV7 of conventional touch key 1001 shown in FIG. 12 is input to judging unit 8, accordingly providing touch key 501 with high sensitivity and reliability. Further, the voltage output from subtracter 6 is suppressed within tolerable range Vr of the voltage input to judging unit 8, accordingly increasing the reliability of judging unit 8.

Exemplary Embodiment 2

The touch key according to Exemplary Embodiment 2 is different from the touch key according to Embodiment 1 shown in FIG. 1 in an operation of reference voltage generator 7. The touch key according to Embodiment 2 is identical to the touch key according to Embodiment 1 in the other operation and components, and hence their description is omitted. A reference voltage output from reference voltage generator 7 is necessarily lower than voltage V2, shown in FIG. 3, output when finger 9 touches electrode 2. The reference voltage, upon being too low, may prevent voltage V1 output when finger 9 touches electrode 2 from falling below tolerable voltage Vk input to judging unit 8, accordingly causing a failure or malfunction of judging unit 8. According to Embodiment 2, the reference voltage output from reference voltage generator 7 is determined based on voltage V2 output when finger 9 touches electrode 2. For example, the reference voltage may be determined so that voltage V4, shown in FIG. 4, calculated by subtracting the reference voltage from voltage V2 becomes 0V. This reference voltage minimizes voltage V3 output from subtracter 6 when finger 9 does not touch electrode 2 as much as possible. Thus, the reference voltage is optimally determined so that the voltage output from subtracter 6 falls within tolerable range Vr of the voltage input to judging unit 8, thus providing the touch key with high sensitivity and reliability.

Exemplary Embodiment 3

The touch key according to Exemplary Embodiment 3 is different from the touch key according to Embodiment 1 shown in FIG. 1 in an operation of reference voltage generator 7. The touch key according to Exemplary Embodiment 3 is identical to the touch key according to Embodiment 1 in other operation and components, and hence, their description is omitted.

The amplitudes of high-frequency voltages Vosc1 and Vosc2 output from oscillator 4 may vary depending on the voltage supplied from power supply 51 to oscillator 4. The amplitudes of output voltages Vosc1 and Vosc2, shown in FIG. 4, output from oscillator 4 decrease, and lower voltages V1 and V2 shown in FIG. 3, accordingly decreasing voltage difference ΔV1 and reducing sensitivity when finger 9 touches electrode 2.

According to Embodiment 3, the reference voltage output from reference voltage generator 7 is determined based on the voltage supplied from the power supply to oscillator 4. In the case that the amplitudes of high-frequency voltages Vosc1 and Vosc2 supplied from oscillator 4 decrease when the power supply voltage supplied to oscillator 4 falls, reference voltage generator 7 sets the reference voltage to a low level. Then, when the power supply voltage supplied to oscillator 4 rises, reference voltage generator 7 sets the reference voltage to a high level. The reference voltage supplied from reference voltage generator 7 is optimally determined, so that the voltage supplied from subtracter 6 falls in tolerable range Vr of the voltage input to judging unit 8 based on the power supply voltage supplied to oscillator 4. This operation decreases fluctuations of voltages V3 and V4 due to fluctuation of the power supply voltage, thus providing the touch key having a highly sensitivity and reliability, and preventing judging unit 8 from failure and malfunction.

Exemplary Embodiment 4

Figure 5:
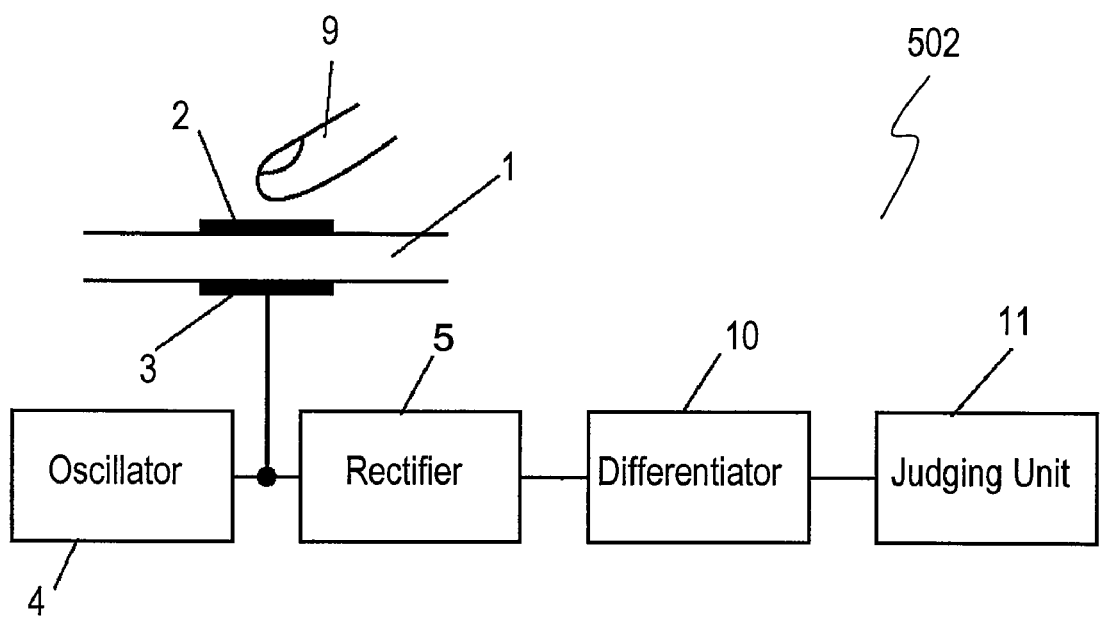
FIG. 5 is a block diagram of a touch key according to Exemplary Embodiments 4 and 5 of the invention.

FIG. 5 is a block diagram of touch key 502 according to Exemplary Embodiment 4. Electrode 2 is provided on a surface of panel 1 made of an electrical insulator, such as glass or ceramics, having a flat surface. Electrode 3 facing electrode 2 is provided on the other surface of panel 1. Electrodes 2 and 3 and panel 1 provide a capacitor. Oscillator 4 outputs a high-frequency voltage, and supplies the voltage to electrode 3. Oscillator 4 has high output impedance. When finger 9, a conductive object, touches electrode 2, electrode 3 is bypassed through panel 1, electrode 2, and finger 9 to be grounded, accordingly reducing the high-frequency voltage at electrode 3 to a voltage lower than the voltage output when finger 9 does not touch electrode 2. Rectifier 5 rectifies and smoothes the high-frequency voltage supplied from oscillator 4, the high-frequency voltage supplied to electrode 3, to convert the voltage to a direct-current (DC) voltage, and outputs the DC voltage to differentiator 10. The DC voltage output from rectifier 5 when electrode 2 is not touched is higher than the DC voltage output when electrode 2 is touched. Differentiator 10 differentiates the DC voltage output from rectifier 5 and outputs the differentiated DC voltage to judging unit 11. Judging unit 11 determines that finger 9 touches electrode 2 when the voltage output from differentiator 10 falls. Judging unit 8 determines that finger 9 moves apart from electrode 2 when the voltage output from differentiator 10 rises.

That is, judging unit 11 determines that finger 9 touches the electrode based on the voltage output from differentiator 10, so that the absolute value of the voltage input to judging unit 11 may not be considered.

Figure 6:
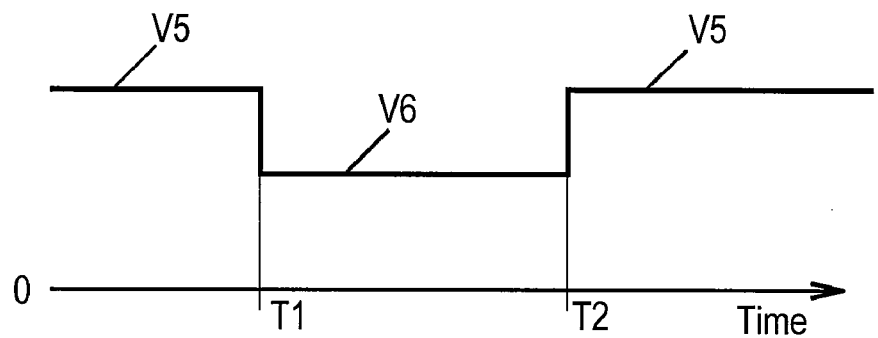
FIG. 6 illustrates a voltage output from the rectifier of the touch key according to Embodiments 4 and 5.
Figure 7:
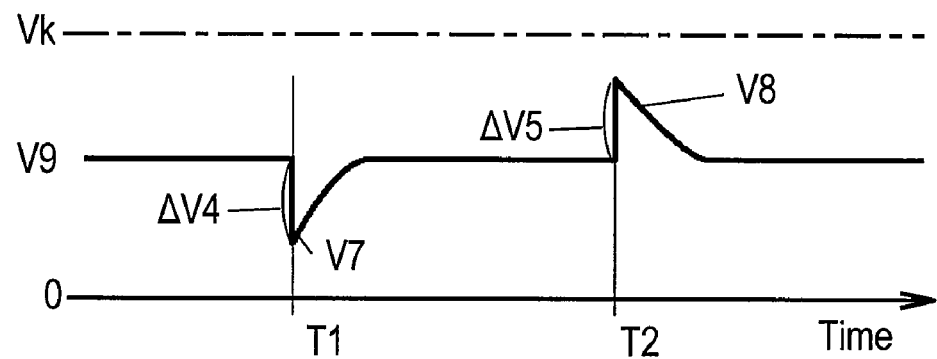
FIG. 7 illustrates a voltage output from a differentiator of the touch key according to Embodiments 4 and 5.

FIGS. 6 and 7 show the voltages output from rectifier 5 and differentiator 10, respectively. Finger 9 does not touch electrode 2 before time T1. Finger 9 touches electrode 2 from time T1 to time T2. Then, finger 9 moves apart from electrode 2 after time T2. Based on the high-frequency voltage output from oscillator 4, rectifier 5 outputs voltage V5 before time T1, outputs voltage V6 lower than voltage V5 from time T1 to time T2, and outputs voltage V5 after time T2. Differentiator 10 outputs voltage V9 before time T1. When finger 9 touches electrode 2 at time T1, the voltage output from rectifier 5 falls from voltage V5 to voltage V6, and differentiator 10 accordingly outputs pulse voltage V7 having a falling edge. After outputting pulse voltage V7, differentiator 10 outputs voltage V9. When finger 9 moves apart from electrode 2 at time T2, the output voltage output from rectifier 5 rises from voltage V6 to voltage V5, and differentiator 10 accordingly outputs pulse voltage V8 having a rising edge. The voltage output from rectifier 5 is differentiated to produce the pulses falling and rising from 0V. In general, a voltage lower than a ground potential (e.g. 0V) cannot be input to judging unit 11 including a microprocessor. Voltage V9 is a bias voltage to be added to the voltage provided by differentiating the voltage output from rectifier 5 at differentiator 10. Voltage V9 is determined so that pulse voltage V8 does not exceed tolerable voltage Vk input to judging unit 11, and that pulse voltage V7 does not fall below 0V. Judging unit 11 determines that finger 9 touches electrode 2 when the voltage input thereto falls, and determines that finger 9 moves apart from electrode 2 when the voltage input thereto rises. This operation provides touch key 502 with high sensitivity and reliability, and prevents judging unit 8 from a failure and malfunction.

Exemplary Embodiment 5

A touch key according to Exemplary Embodiment 5 is different from touch key 502 according to Embodiment 4 shown in FIG. 5 in an operation of judging unit 11. The touch key according to Embodiment 5 is identical to touch key 502 the other components, and their description is omitted. According to Embodiment 4, judging unit 11 determines that finger 9 touches electrode 2 when the voltage input thereto falls, and determines that finger 9 moves apart from electrode 2 when the voltage input thereto rises. According to Embodiment 5, judging unit 11 detects voltage difference ΔV4 between voltage V7 output from differentiator 10 and voltage V9, namely, a falling value, and detects voltage difference ΔV5 between voltage V8 and voltage V9, namely a rising value. Judging unit 11 ignores detected voltage differences ΔV4 and ΔV5 if the voltage differences are smaller than predetermined values. That is, according to Embodiment 5, judging unit 11 determines that finger 9 touches electrode 2 when the voltage input thereto falls, and when change ΔV4 of the falling is larger than the predetermined value. Judging unit 11 determines that finger 9 moves apart from electrode 2 when the voltage input thereto rises and when change ΔV5 of the rising is larger than the predetermined value. This operation provides the touch key with high sensitivity and reliability, and preventing the judging unit from failure and malfunction.

Exemplary Embodiment 6

Figure 8:
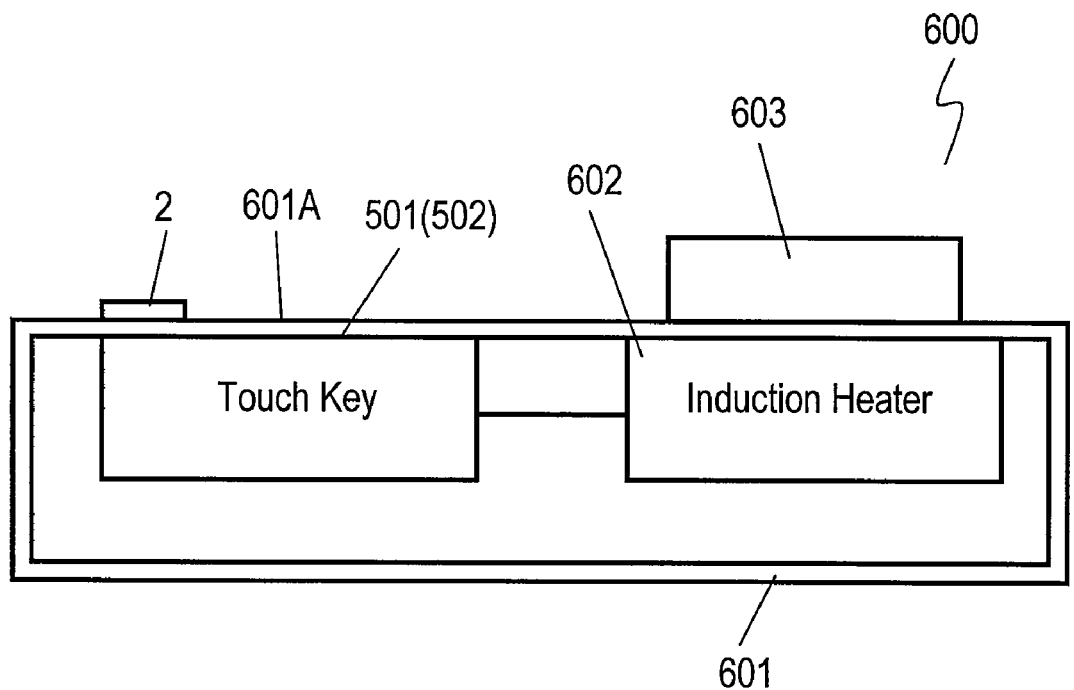
FIG. 8 is a schematic diagram of an induction heating cooker according to Exemplary Embodiment 6 of the invention.
Figure 9:
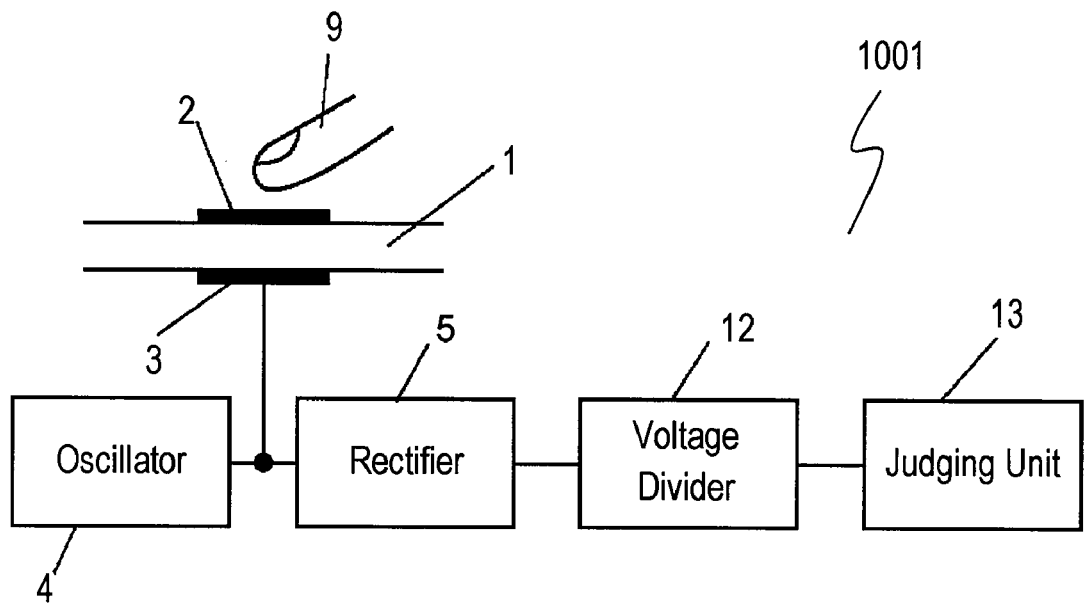
FIG. 9 is a block diagram of a conventional touch key.
Figure 10:
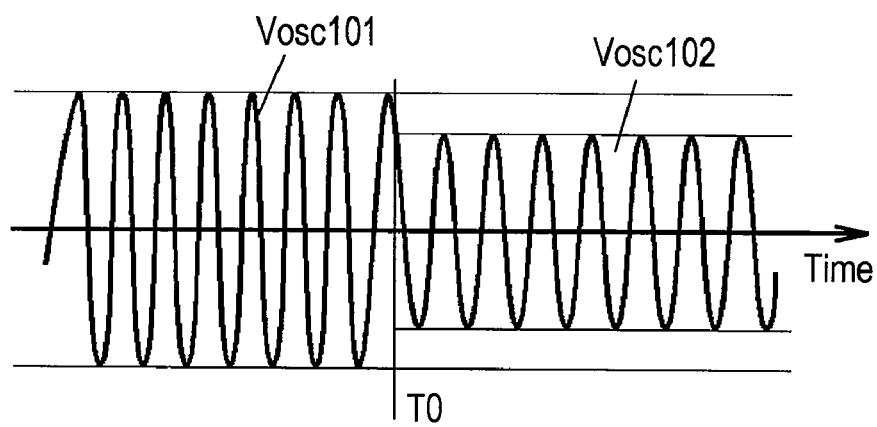
FIG. 10 illustrates a voltage output from an oscillator of the conventional touch key.
Figure 11:
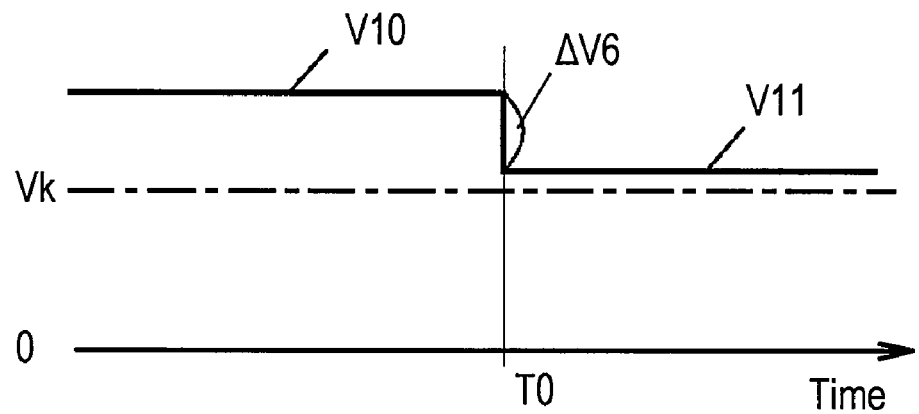
FIG. 11 illustrates a voltage output from a rectifier of the conventional touch key.

FIG. 8 is a schematic diagram of induction heating cooker 600 according to Exemplary Embodiment 6 of the present invention. Induction heating cooker 600 includes cabinet 601, induction heater 602, and touch key 501 according to Embodiments 1 to 3 shown in FIGS. 1 to 4. Induction heater 602 includes a heating coil and an inverter for generating a high-frequency magnetic field having a frequency higher than 20 kHz. Cabinet 601 includes top plate 601A made of ceramic. Electrode 2 is provided on a top surface of top plate 601A at a side closer to a user. Electrode 3 is provided on a bottom surface of top plate 601A. Top plate 601A made of insulating material functions as panel 1 shown in FIGS. 1 and 5.

The user touches electrode 2 of touch key 501 with finger 9 to send an instruction, such as start/stop heating, to induction heater 602, and judging unit 8 determines that finger 9 touches electrode 2. This instruction is sent to induction heater 602 according to a judgment result of judging unit 8. Induction heater 602 then induction-heats pot 603, an object to be heated, placed on top plate 601A with the high-frequency magnetic field according to the instruction.

Induction heating cooker 600 allows the user to activate touch key 501 while he/she looks at a material to be coked in pot 603, the object to be heated. Particularly when electrode 2 is touched to activate touch key 501 during cooking, high sensitivity is required since electrode 2 or finger 9 is contaminated or since electrode 2 is lightly touched. The induction heating cooker includes the heating coil and the inverter which generate a strong high-frequency magnetic field and switching noises extremely near the touch key, the touch key is required to have high noise immunity. Touch key 501 has the high sensitivity and is hardly influenced by noises, hence providing reliable induction heating cooker 600 to be used easily, since the material to be cooked can be looked at during cooking.

Induction heating cooker 600 may include touch key 502 according to Embodiment 4 or 5 shown in FIGS. 5 to 7 instead of touch key 501.

Touch keys 501 and 502 according to Embodiments 1 to 8 can be used for household appliances, such as a microwave oven and other devices, as well as the induction heating cooker with the same effects.

The present invention is not limited to Embodiments 1 to 6.

INDUSTRIAL APPLICABILITY

A touch key according to the present invention has high sensitivity, reliability, and tolerance to noise, hence being useful for household appliances, such as an induction heating cooker and a microwave oven.

The invention claimed is:
1. A cooker comprising:
   a touch key including:
      an electrode arranged to be touched with an object;
      an oscillator for outputting a high-frequency voltage and supplying the high-frequency voltage to the electrode;
      a rectifier for rectifying and smoothing the high-frequency voltage supplied from the oscillator as to output a direct-current (DC) voltage;
      a differentiator for differentiating the voltage output from the rectifier; and
      a judging unit for determining that the object touches the electrode when the voltage output from the differentiator falls;
   a top plate having the touch key provided thereon; and
   an induction heater for induction-heating an object to be heated placed on the top plate according to a judgment result of the judging unit of the touch key.

2. A cooker according to claim 1, wherein the judging unit determines that the object touches the electrode when the voltage output from the differentiator falls and when a change of the voltage output from the differentiator is larger than a predetermined value.

3. A cooker according to claim 1, wherein the judging unit determines that the object moves apart from the electrode when the voltage output from the differentiator rises.

4. A cooker according to claim 3, wherein the judging unit determines that the object moves apart from the electrode when the voltage output from the differentiator rises and when a change of the voltage output from the differentiator is larger than a predetermined value.

\* \* \* \* \*